United States Patent
Song

(12) United States Patent (10) Patent No.: US 6,709,525 B2
Song (45) Date of Patent: Mar. 23, 2004

(54) LOW PRESSURE CHEMICAL VAPOR DEPOSITION APPARATUS OF VERTICAL TYPE FOR FABRICATING SEMICONDUCTOR DEVICES

(75) Inventor: Youn-Seok Song, Yongin (KR)

(73) Assignee: Samsung Electronics Co., Ltd., Suwon (KR)

( * ) Notice: Subject to any disclaimer, the term of this patent is extended or adjusted under 35 U.S.C. 154(b) by 99 days.

(21) Appl. No.: 10/136,283

(22) Filed: May 2, 2002

(65) Prior Publication Data

US 2003/0010291 A1 Jan. 16, 2003

(30) Foreign Application Priority Data

Jul. 10, 2001 (KR) .......................................... 2001-41081

(51) Int. Cl.[7] .............................................. C23C 16/00
(52) U.S. Cl. ....................... 118/733; 118/724; 118/725; 432/241; 432/250
(58) Field of Search ................................. 118/725, 733; 432/241, 250

(56) References Cited

U.S. PATENT DOCUMENTS

| | | | | |
|---|---|---|---|---|
| 5,207,573 A | * | 5/1993 | Miyagi et al. ............... | 432/182 |
| 5,224,503 A | * | 7/1993 | Thompson et al. ......... | 134/95.2 |
| 5,224,999 A | * | 7/1993 | Shiraiwa et al. ............ | 118/724 |
| 5,556,275 A | * | 9/1996 | Sakata et al. ................ | 432/241 |
| 5,578,132 A | | 11/1996 | Yamaga et al. .............. | 118/724 |
| 5,622,639 A | | 4/1997 | Kitayama et al. ........... | 219/390 |
| 5,846,073 A | * | 12/1998 | Weaver ....................... | 432/241 |
| 2003/0010291 A1 | * | 1/2003 | Song ........................... | 118/724 |

* cited by examiner

*Primary Examiner*—Jeffrie R. Lund
(74) *Attorney, Agent, or Firm*—Volentine Francos, PLLC

(57) ABSTRACT

A vertical type chemical vapor deposition apparatus includes a process chamber having a cylindrical inner tube and a cap shaped outer tube surrounding and apart from the inner tube. A manifold is coupled with lower portions of the inner and outer tubes, and has a lower portion tapered at an inclination angle. A heater is provided at an outer side of the outer tube for heating the process chamber. A boat is movable into and out of the process chamber through the manifold, as driven by an elevator. The boat is vertically loaded with wafers. A cap is fixed to the elevator at a lower portion of the boat, and has a portion contactable with the manifold that is tapered at a same inclination angle as the lower portion of the manifold. An O-ring is inserted into the portion of the cap contactable with the manifold.

15 Claims, 5 Drawing Sheets ell# LOW PRESSURE CHEMICAL VAPOR DEPOSITION APPARATUS OF VERTICAL TYPE FOR FABRICATING SEMICONDUCTOR DEVICES The present application claims priority under 35 U.S.C. §119 to Korean Application No. 2001-41081 filed on Jul. 10, 2001, which is hereby incorporated by reference in its entirety for all purposes.

BACKGROUND OF THE INVENTION

1. Field of the Invention

The present invention relates to a vertical type low pressure chemical vapor deposition apparatus for fabricating a semiconductor device, and more particularly, to a vertical type low pressure chemical vapor deposition apparatus for fabricating a semiconductor device in which sealing leaks through the closely contacted surfaces between a manifold and a cap, due to byproducts such as quartz powder, can be prevented.

2. Description of the Related Art

A conventional vertical type low pressure chemical vapor deposition apparatus for fabricating a semiconductor device supplies a predetermined gas that is necessary to form a thin film on a wafer into a process chamber at high temperature and low pressure. The conventional vertical type low-pressure chemical vapor deposition apparatus for fabricating a semiconductor device comprises a vertical type heating chamber and a boat that is received in the vertical type heating chamber.

The heating chamber comprises a process chamber consisting of an inner tube and an outer tube spaced apart from the inner tube by a predetermined distance, and a manifold coupled to a lower portion of the process chamber. The manifold is generally made of stainless steel, flange-coupled at the upper portion thereof with a lower portion of the outer tube, and coupled with a lower portion of the inner tube at an inner side thereof that is vertically extended. The outer tube is provided at an external side thereof with a heater for heating the internal side of the heating chamber.

The boat is loaded with a large number of wafers that are stacked in a vertical direction, and the boat is moved up and down into the heating chamber by an elevator. As illustrated in FIG. 1, the manifold 20 is in close surface contact with the cap 60 of the boat that is inserted into the process chamber, thereby sealing the process chamber. That is, the manifold 20 is in tight horizontal surface contact with the cap 60 at the bottom surface thereof, and an O-ring 70 is tightly inserted between the manifold 20 and the cap 60, thereby maintaining airtight characteristics in the process chamber, as illustrated in FIG. 1A.

As the boat repeatedly moves in and out of the process chamber a great number of times, the contact surfaces between the manifold 20, and the cap 60 and the O-ring 70, are worn away, damaged and changed, thereby resulting in air leaks in the process chamber. To solve such a problem, U.S. Pat. No. 5,578,132 discloses an apparatus and a method for improving the structure of the process chamber. However, in addition to the problem caused by the O-ring, there is another problem in that since the inner tube, the outer tube, and the boat are made of quartz, they crack due to repeated changes in temperature, pressure, reactive gas, etc. in the process chamber over a span of many hours, so that a byproduct such as quartz powder is created and comes apart from the inner and outer tubes. As a result, the byproduct is accumulated on the upper portion of the cap 60 and collected between the contact surfaces of the manifold 20 and the cap 60, thereby damaging sealing between the manifold 20 and the cap 60, as illustrated in FIG. 2.

In other words, a byproduct such as quartz powder comes off from the inner and outer tubes, and a part of the byproduct accumulates near the O-ring between the contact surfaces of the manifold 20 and the cap 60, thereby creating leaks in the airtight sealing. As a result, a constant vacuum pressure in the process chamber cannot be maintained while the boat is loaded into the process chamber and the processes are performed. Consequently, thin films on a wafer cannot be formed properly, so that inferior products are created and productivity decreases.

SUMMARY OF THE INVENTION

The present invention is therefore directed to a low pressure chemical vapor deposition apparatus of vertical type for fabricating semiconductor devices, which substantially overcomes one or more of the problems due to the limitations and disadvantages of the related art.

To solve the aforementioned problems, it is an object of the present invention to provide a vertical type chemical vapor deposition apparatus by which byproducts can be prevented from accumulating on the contact surfaces between a cap and a manifold, thereby increasing reliability of processing.

It is another object of the present invention to provide a vertical-type chemical vapor deposition apparatus by which the number of inferior wafers produced can be reduced, and productivity can be increased.

In order to achieve the above objects, the vertical type chemical vapor deposition apparatus includes a process chamber having a cylindrical inner tube and a cap shaped outer tube surrounding and apart from the inner tube; a manifold, coupled with lower portions of the inner tube and the outer tube, having a lower portion tapered at an inclination angle; a heater, provided at an outer side of the outer tube, that heats an inner side of the process chamber to a process temperature; a boat that is movable into and out of the process chamber through the manifold as driven by an elevator, the boat being vertically loaded with a plurality of wafers; a cap, fixed to the elevator and coupled to a lower portion of the boat, having a portion that is contactable with the manifold and that is tapered at a same inclination angle as the lower portion of the manifold; and an O-ring inserted into the portion of the cap that is contactable with the manifold.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
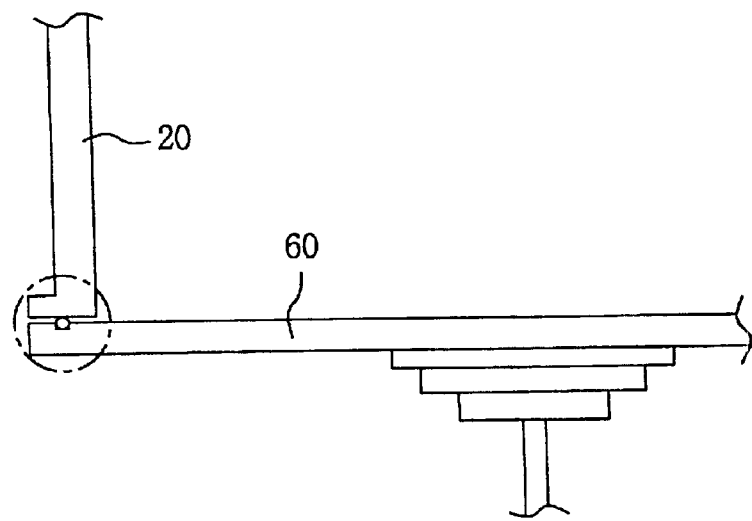
FIG. 1 is an enlarged cross sectional view showing a closely contacted cap and manifold of a conventional vertical type low pressure chemical vapor deposition apparatus for fabricating a semiconductor device.
Figure 1A:
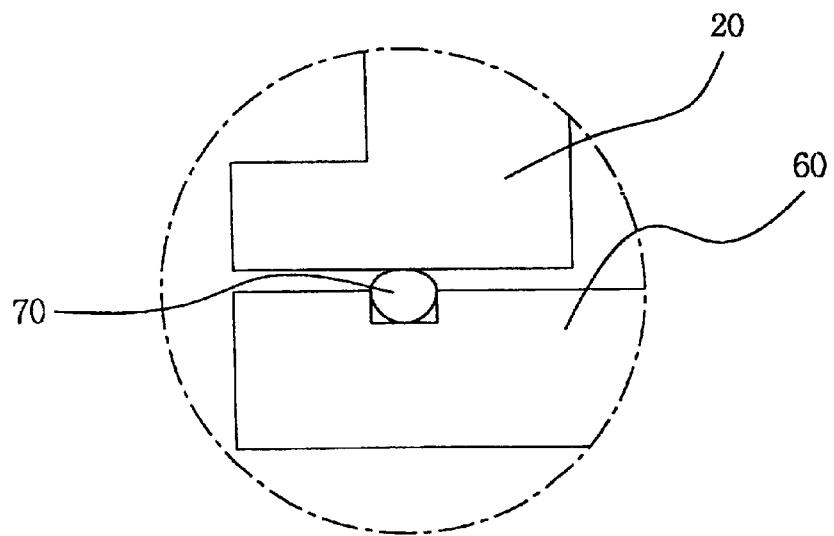
FIG. 1A is an exploded view of the contact area.
Figure 2:
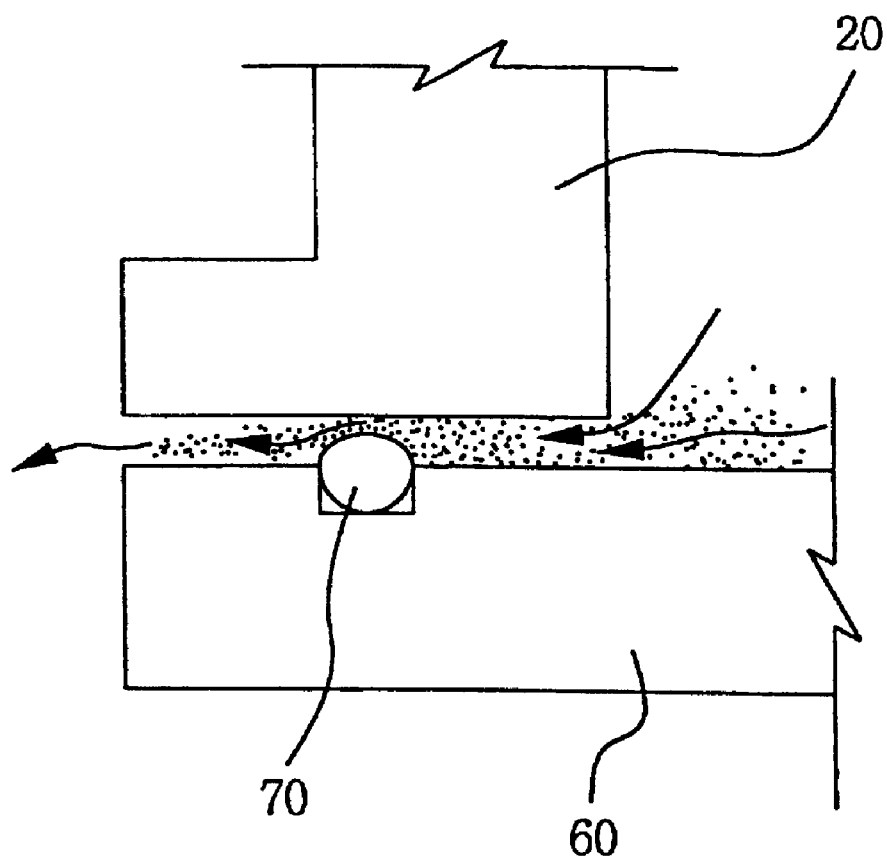
FIG. 2 is an enlarged cross sectional view showing the structure of FIG. 1, in which a byproduct is deposited between the contact surfaces of the manifold and the cap.

Hereinafter, the present invention will be described in detail with reference to the accompanying drawings. It should be noted that like reference numerals are used throughout the accompanying drawings for designation of like or equivalent parts or portion, for simplicity of illustration and explanation. Also, in the following description, details will be given to provide a thorough understanding of the present invention. It should however be apparent to one skilled in the art that the present invention can be achieved without the above noted details. Also, there will be omission of detailed description of well-known functions and structures, so as to clarify key points of the present invention.

Figure 3:
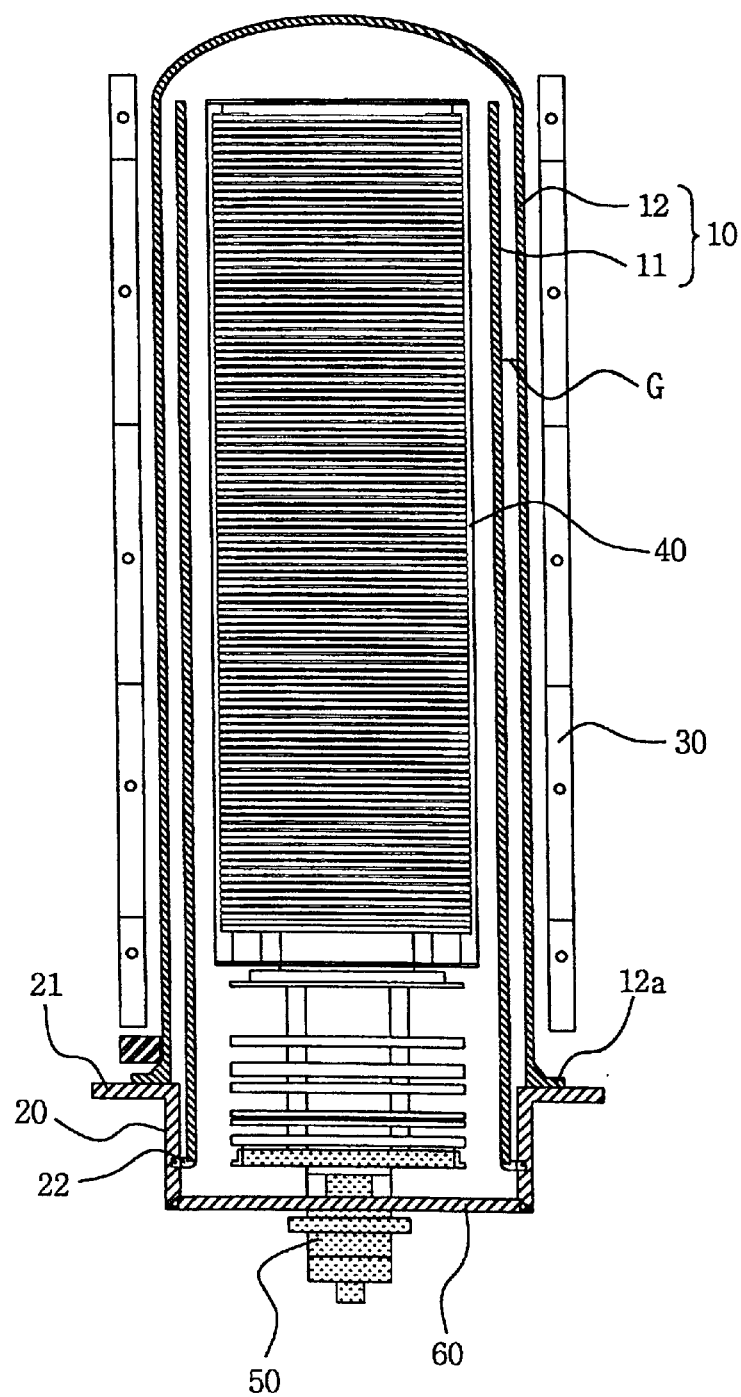
FIG. 3 is a cross sectional view showing a vertical type low pressure vapor deposition apparatus for fabricating a semiconductor device, according to the present invention.

FIG. 3 is a cross sectional view showing a vertical type chemical vapor deposition apparatus according to the present invention. In the apparatus, the process chamber 10 comprises an inner tube 11 and an outer tube 12 spaced apart from the inner tube 11. The inner tube 11 is vertically formed in a cylindrical shape, and reaction of gases occurs in the inner tube. The outer tube 12 is opened at its lower portion and closed at its bell shaped upper portion. The outer tube 12 surrounds the inner tube 11 and is spaced apart from the inner tube 11 with a predetermined gap (G). The outer tube 12 is shorter at its lower portion than the inner tube 11 and is extended outward at its end to form a flange surface 12a. The inner and outer tubes 11 and 12 are made of quartz, or suitably appropriate material.

The process chamber 10 is provided at its lower portion with manifold 20 made of stainless steel, or a suitably appropriate material. The manifold 20 is cylindrically shaped, larger than the outer diameter of the inner tube 11 and smaller than the outer diameter of the outer tube 12. Particularly, the upper portion of the manifold 20 is extended outward in a radial direction to form the flange surface 21.

At about a middle portion of the sidewall of manifold 20, a recess 22 is formed in cylindrical shape, whereby an end portion of the inner tube 11 is fastened therein to manifold 20. Accordingly, the end portion of the inner tube 11 is fastened by the recess 22 of the manifold 20, thereby being fixed thereto. The end portion flange surface 12a of the outer tube 12 is coupled to the flange 21 of the manifold 20, so as to be fixed thereto.

Figure 4:
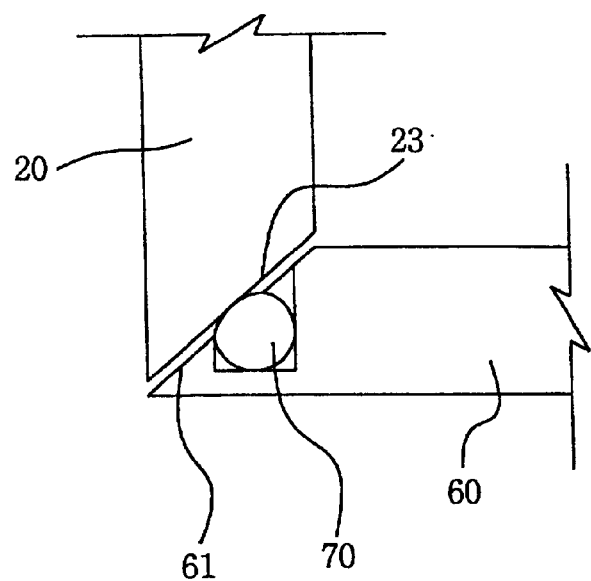
FIG. 4 is an enlarged cross sectional view showing the structure of the apparatus of the present invention, in which the contact surfaces between the manifold and the cap are slanted in a downward direction toward the outside of the chamber.
Figure 6:
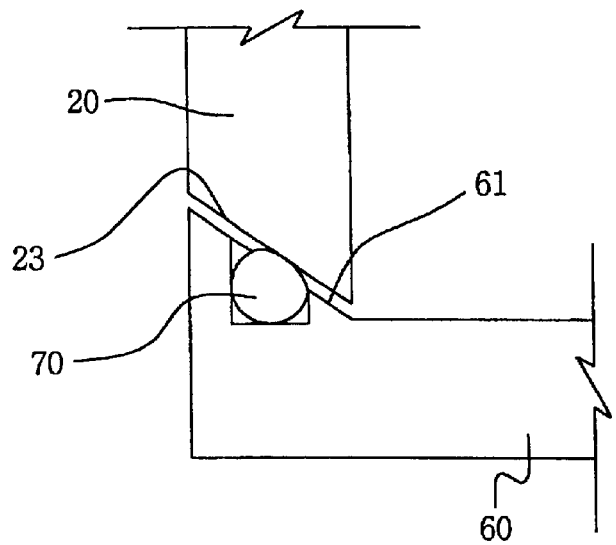
FIG. 6 is an enlarged cross sectional view showing the structure of the apparatus of the present invention, in which the contact surfaces between the manifold and the cap are slanted in a downward direction toward the internal side of the chamber.

The other end portion of the manifold 20 is formed with a slanted surface 23, relative to cap 60. The slanted surface 23 of the manifold 20 may be slanted in a downward direction toward the outside of the process chamber 10 as shown in FIG. 4, or may be slanted in a downward direction toward the inner side of the process chamber 10 as shown in FIG. 6.

A heater 30 is provided at the outside of the outer tube 12, for heating a reaction room or inside of the process chamber 10.

A boat 40, which is generally made of quartz or a suitably appropriate material, is provided at a lower position of the manifold 20 and is coupled to an elevator lift 50. The boat 40 has numerous wafers vertically loaded thereon and moves upward and downward as driven by the elevator lift 50, into and out of a reaction room of the process chamber 10.

Figure 5:
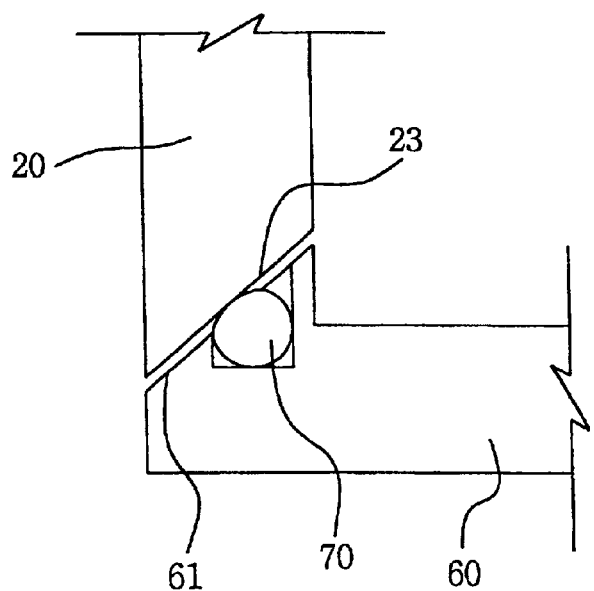
FIG. 5 is an enlarged cross sectional view showing the structure of the apparatus of the present invention, in which a portion of the cap that is closely contacted to the manifold is upwardly projected as having a height.
Figure 7:
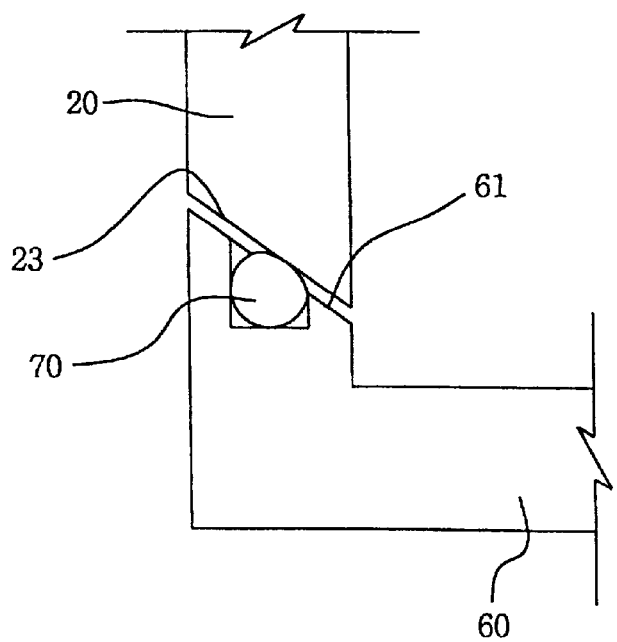
FIG. 7 is an enlarged cross sectional view showing the structure of the apparatus of the present invention, in which a portion of the cap that is closely contacted to the manifold is upwardly projected as having a predetermined height.

The cap 60 is in the form of a plate and is fixed to the elevator lift 50, as shown in FIG. 3. The diameter of the cap 60 is the same as, or a little larger than that of a lower portion of the manifold 20. As may be understood in view of any of FIGS. 4–7, the edge section (slanted surface 61) of the cap 60 is slanted parallel with and contacts with slanted lower section or surface 23 of the manifold 20. An O-ring 70 is inserted into the slanted surface 61 of the cap 60. The slanted surface 61 of the cap 60 and the slanted surface 23 of manifold 20 may be slanted in a downward direction toward the outside of the process chamber 10 as in FIGS. 4 and 5, or in a downward direction toward the inner side of the process chamber 10 as in FIGS. 6 and 7. It is necessary for the contact portion of the cap 60 to be extended upward toward the outside of process chamber 10 in order for the slanted surface 23 to be slanted downward toward the inner side of the process chamber 10, as shown in FIG. 7. In addition, the portion of the cap 60 where the slanted surface 61 is formed may be extended upward to a predetermined height relative to cap 60, as shown in FIG. 5.

The operation of the chamber is performed in such a manner that the boat 40 is loaded with wafers and moves upward as driven by elevator lift 50, to enter into a reaction room in the process chamber 10, like in a conventional apparatus. In order to maintain the reaction room in a vacuum state, the slanted surface 23 of the manifold 20 and the slanted surface 61 of the cap 60 are tightly contacted with each other, so that the process chamber 10 is entirely closed. If the reaction room of the process chamber 10 is entirely closed by the tightly contacted surfaces between the manifold 20 and the cap 60, and if the heater 30 is driven, the process chamber 10 is heated and enters into a vacuum state. During this state, the reaction room is supplied with process gases through one side thereof, in order to form a thin film on a wafer.

During repeated processes as described, the inner tube 11, outer tube 12, and boat 40, which are made of quartz for example, become cracked and damaged little by little due to changes in temperature, pressure, etc. in the process chamber 10. After many hours, a byproduct such as quartz powder comes off of quartz tubes 11 and 12, and accumulates on the cap 60. A portion of the byproduct accumulated on the cap 60 is induced to the circumference portion of the cap 60 that is contacted with the manifold 20. The byproducts, which are induced into the gap between the slanted surfaces 23 and 61 of the manifold 20 and the cap 60, flow into the inner side of the process chamber 10 or flow out of the process chamber 10 when the cap 60 is opened, thereby being removed from the gap between the contact surfaces of the manifold 20 and the cap 60. In other words, the byproducts induced into the gap between the slanted surfaces 23 and 61 of the manifold 20 and the cap 60 slide down the slanted surface 61 due to the angle of inclination thereof when the cap 60 is opened, thereby preventing the byproducts from accumulating on the slanted surface 61.

When the slanted surface 61 of the cap 60 is slanted toward the outside of the process chamber 10, the byproducts slide down the slanted surface 61 and flow out the process chamber 10 when the cap 60 is opened, thereby being removed from the surface 61 of the cap 60, as may be understood in view of FIG. 4. In this case, the portion where the slanted surface 61 is formed may be extended upward to a predetermined height, as shown in FIG. 5.

To the contrary, when the slanted surface 61 of the cap 60 is slanted to the inner side of the process chamber 10, as shown in FIGS. 6 and 7, the byproducts slide down the slanted surface 61 and are induced into the inner side of the process chamber 10, when the cap 60 is opened.

As described above, the byproduct such as quartz powder created from the tubes 11 and 12 does not accumulate on the slanted surface 61 of the cap 60 with which the surface 23 of the manifold 20 is contacted, thereby maintaining sealing characteristics of the cap 60 for a long time. As a result, the processes for forming thin films for fabricating a semiconductor device can be safely performed, thereby preventing the occurrence of bad wafers and process failures. Particularly, since damage or change in the O-ring 70 provided in the slanted surface 61 can be prevented, the life time of the O-ring 70 can be prolonged.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A vertical type chemical vapor deposition apparatus comprising:
   a process chamber having a cylindrical inner tube and a cap shaped outer tube surrounding and apart from the inner tube;
   a manifold, coupled with lower portions of the inner tube and the outer tube, having a lower portion at a circumference thereof tapered at an inclination angle;
   a heater, provided at an outer side of the outer tube, that heats an inner side of the process chamber to a process temperature;
   a boat that is movable into and out of the process chamber through the manifold as driven by an elevator, the boat being vertically loaded with a plurality of wafers;
   a cap, fixed to the elevator and coupled to a lower portion of the boat, having a portion that is contactable with the manifold and that is tapered at a same inclination angle as the lower portion of the manifold; and
   an O-ring inserted into the portion of the cap that is contactable with the manifold.

2. The vertical type chemical vapor deposition apparatus of claim 1, wherein the lower portion of the manifold and the portion of the cap are each slanted downward toward an outside of the process chamber.

3. The vertical type chemical vapor deposition apparatus of claim 2, wherein the portion of the cap is extended a height relative to a bottom of the cap.

4. The vertical type chemical vapor deposition apparatus of claim 1, wherein the lower portion of the manifold and the portion of the cap are each slanted downward toward an inside of the process chamber.

5. The vertical type chemical vapor deposition apparatus of claim 4, wherein the portion of the cap is extended a height relative to a bottom of the cap.

6. A vertical type chemical vapor deposition apparatus comprising:
   a process chamber having a cylindrical chamber wall;
   a manifold, connected to a bottom portion of the cylindrical chamber wall, having a lower circumferential wall that is tapered at an inclination angle; and
   a boat, insertable into the process chamber through the manifold, having a cap fixed to lower portion thereof, the cap having a portion that is contactable with the lower circumferential wall of the manifold when the boat is fully inserted into the process chamber and that has a same inclination angle as the lower circumferential wall of the manifold.

7. The vertical type chemical vapor deposition apparatus of claim 6, wherein the inclination angle of the lower circumferential wall of the manifold and the portion of the cap that is contactable with the lower circumferential wall of the manifold is downward toward an inside of the process chamber.

8. The vertical type chemical vapor deposition apparatus of claim 7, wherein the cap has a base, and the portion of the cap that is contactable with the lower circumferential wall of the manifold has a step height that extends from the base of the cap.

9. The vertical type chemical vapor deposition apparatus of claim 6, wherein the inclination angle of the lower circumferential wall of the manifold and the portion of the cap that is contactable with the lower circumferential wall of the manifold is downward toward an outside of the process chamber.

10. The vertical type chemical vapor deposition apparatus of claim 9, wherein the cap has a base, and the portion of the cap that is contactable with the lower circumferential wall of the manifold has a step height that extends from the base of the cap.

11. The vertical type chemical vapor deposition apparatus of claim 6, further comprising an O-ring inserted into the portion of the cap that is contactable with the lower circumferential wall of the manifold.

12. The vertical type chemical vapor deposition apparatus of claim 6, wherein the cylindrical chamber wall comprises an inner tube and a cylindrical shaped outer tube surrounding and apart from the inner tube.

13. The vertical type chemical vapor deposition apparatus of claim 6, further comprising a heater, provided at an outer side of the process chamber, that heats the process chamber.

14. The vertical type chemical vapor deposition apparatus of claim 6, further comprising an elevator lift mechanically coupled to the cap, that moves the boat into and out of the process chamber.

15. The vertical type chemical vapor deposition apparatus of claim 6, wherein the cylindrical chamber wall and the boat are quartz.

* * * * *